United States Patent
Yun

(10) Patent No.: US 10,491,158 B2
(45) Date of Patent: Nov. 26, 2019

(54) WIRELESS COMMUNICATION APPARATUS AND METHOD

(71) Applicant: SAMSUNG ELECTRONICS CO., LTD., Suwon-si (KR)

(72) Inventor: Seok Ju Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 15/838,971

(22) Filed: Dec. 12, 2017

(65) Prior Publication Data

US 2018/0309406 A1    Oct. 25, 2018

(30) Foreign Application Priority Data

Apr. 20, 2017 (KR) .......................... 10-2017-0050827

(51) Int. Cl.

| | |
|---|---|
| H03B 5/12 | (2006.01) |
| H03F 1/32 | (2006.01) |
| H03F 3/45 | (2006.01) |
| H04B 1/04 | (2006.01) |
| H04B 1/40 | (2015.01) |

(52) U.S. Cl.
CPC .......... *H03B 5/1206* (2013.01); *H03B 5/124* (2013.01); *H03B 5/129* (2013.01); *H03B 5/1215* (2013.01); *H03B 5/1228* (2013.01); *H03B 5/1234* (2013.01); *H03B 5/1246* (2013.01); *H03B 5/1265* (2013.01); *H03B 5/1271* (2013.01); *H03F 1/3211* (2013.01); *H03F 3/45179* (2013.01); *H04B 1/0475* (2013.01); *H04B 1/40* (2013.01)

(58) Field of Classification Search
CPC ..................................................... H03B 5/1206
USPC ...................................................... 331/177 V
See application file for complete search history.

(56) References Cited

U.S. PATENT DOCUMENTS

| | | | |
|---|---|---|---|
| 8,149,067 | B2 | 4/2012 | Okada |
| 8,442,172 | B1 | 5/2013 | Dokania et al. |
| 8,472,890 | B2 | 6/2013 | Zhuo et al. |
| 8,908,798 | B2 | 12/2014 | Wilson et al. |
| 9,083,424 | B2 | 7/2015 | Otis et al. |
| 9,197,221 | B2 | 11/2015 | Babaie et al. |
| 9,319,256 | B2 | 4/2016 | Park et al. |
| 2007/0222519 | A1 | 9/2007 | Deng et al. |

(Continued)

FOREIGN PATENT DOCUMENTS

| | | |
|---|---|---|
| JP | 2011-66721 A | 3/2011 |
| JP | 2015-228702 A | 12/2015 |

OTHER PUBLICATIONS

Extended European Search Report dated May 7, 2018 in corresponding European Application No. 18153334.0 (7 pages in English).

(Continued)

*Primary Examiner* — Joseph Chang
(74) *Attorney, Agent, or Firm* — NSIP Law

(57) ABSTRACT

A wireless communication apparatus includes an oscillator circuit configured to generate an oscillation signal corresponding to an oscillation frequency determined by an antenna, and a bias generator circuit configured to reconfigure an operation region mode of a transistor included in the oscillator circuit by adjusting a bias signal in response to an enable signal.

22 Claims, 11 Drawing Sheets

(56) References Cited

U.S. PATENT DOCUMENTS

| | | |
|---|---|---|
| 2010/0233977 A1* | 9/2010 | Minnis ............. H03F 1/0211 455/127.1 |
| 2012/0142283 A1 | 6/2012 | Taya |
| 2012/0286889 A1 | 11/2012 | Park et al. |
| 2013/0316661 A1 | 11/2013 | Lee et al. |
| 2014/0028406 A1 | 1/2014 | Cao |
| 2014/0120971 A1 | 5/2014 | Megard et al. |
| 2016/0099691 A1 | 4/2016 | Babaie et al. |

OTHER PUBLICATIONS

Bohorquez, Jose L., et al. "A 350µW CMOS MSK Transmitter and 400µW OOK Super-Regenerative Receiver for Medical Implant Communications", *IEEE Journal of Solid Circuits*, 44.4, (Apr. 2009): 1248-1259 (12 pages, in English).

Fanori, Luca, et al. "Highly Efficient Class-C CMOS VCOs, Including a Comparison With Class-B VCOs." *IEEE Journal of Solid-State Circuits* 48.7 (2013): 1730-1740. (11 pages, in English).

Mazzanti, Andrea, et al. "A Push—Pull Class-C CMOS VCO." *IEEE Journal of Solid-State Circuits* 48.3 (2013): 724-732. (9 pages, in English).

Mazzanti, Andrea, et al. "Class-C Harmonic CMOS VCOs, With a General Result on Phase Noise." *IEEE Journal of Solid-State Circuits* 43.12 (2008): 2716-2729. (14 pages, in English).

\* cited by examiner

WIRELESS COMMUNICATION APPARATUS AND METHOD

CROSS-REFERENCE TO RELATED APPLICATION(S)

This application claims the benefit under 35 USC § 119(a) of Korean Patent Application No. 10-2017-0050827 filed on Apr. 20, 2017, in the Korean Intellectual Property Office, the entire disclosure of which is incorporated herein by reference for all purposes.

BACKGROUND

1. Field

The following description relates to wireless communication technology.

2. Description of Related Art

A wireless transceiver operates using an oscillator configured to change an oscillation frequency in a desired range. The oscillator may include a combination of a capacitor and an inductor. For example, an analog LC voltage control oscillator in which an oscillation frequency is changed in response to a change in capacitance of a capacitor of an oscillation circuit varying based on a control voltage may be used.

In recent years, miniaturization of a transceiver has been required in, for example, a medical field. To this end, miniaturization of an external element related to radio frequency (RF) matching is required. Also, in an RC chip, a number of RF blocks and an area for each of the RF blocks may beneficially be minimized.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wireless communication apparatus includes an oscillator circuit configured to generate an oscillation signal corresponding to an oscillation frequency determined by an antenna; and a bias generator circuit configured to reconfigure an operation region mode of a transistor included in the oscillator circuit by adjusting a bias signal in response to an enable signal.

The bias generator circuit may be configured to apply a first bias voltage to the transistor in a reception mode and apply a second bias voltage differing from the first bias voltage to the transistor in a transmission mode.

The bias generator circuit may be configured to apply the first bias voltage to the transistor in a transient state interval of the transmission mode and apply the second bias voltage to the transistor in a steady state interval after the transient state interval.

The bias generator circuit may be configured to apply the second bias voltage to a gate node of the transistor included in the oscillator circuit in response to a delayed transmission target signal.

The bias generator circuit may be configured to determine a magnitude of the second bias voltage based on a common mode voltage of an output signal, a differential voltage of the output signal, and a threshold of the transistor.

The bias generator circuit may be configured to determine a magnitude of the first bias voltage based on a common mode voltage of an output signal.

The bias generator circuit may be configured to configure the transistor included in the oscillator circuit to operate in a saturation region such that a current flowing through the antenna has a fundamental frequency in a transmission mode.

The bias generator circuit may be configured to prevent the transistor included in the oscillator circuit from operating in a deep triode region.

The bias generator circuit may be configured to supply the bias signal to the oscillator circuit by determining the bias signal such that an average value of the second bias voltage is greater than an average value of a drain voltage of the transistor.

The bias generator circuit may be configured to apply the bias signal to a gate node of the transistor included in the oscillator circuit.

The antenna may include a capacitor and an inductor.

The capacitor may include a capacitor bank having a variable capacitance value.

In a process of transmitting a transmission target signal, the oscillator circuit may be configured to operate based on a first bias voltage in a transient state interval and operate based on a second bias voltage in a steady state interval, wherein the first bias voltage may be different than the second bias voltage.

The wireless communication apparatus may further include a transmission switch configured to connect a capacitor to a source node of the transistor included in the oscillator circuit in response to the wireless communication apparatus entering a transmission mode.

The oscillator circuit may include a transistor pair including two transistors connected to each other, a capacitor connecting a gate node of a transistor of the two transistors and a drain node of the other transistor of the two transistors, and a resistor connecting a gate node of a transistor of the two transistors and a gate node of the other transistor of the two transistors.

The oscillator circuit may include a first transistor pair including two N-type metal-oxide-semiconductor (NMOS) transistors mutually connected to be oscillated using a resistor and a capacitor; and a second transistor pair including two P-type metal-oxide-semiconductor (PMOS) transistors mutually connected to be oscillated using a resistor and a capacitor.

The wireless communication apparatus may further include a delay circuit configured to provide, to the bias generator circuit, a delayed transmission target signal generated by delaying a transmission target signal in response to the wireless communication apparatus entering a transmission mode.

The wireless communication apparatus may further include a resonance switch configured to switch on or off a connection between both ends of the antenna in response to a transmission target signal; and a current source switch configured to change a current flowing to the oscillator circuit in response to the transmission target signal.

The wireless communication apparatus may be configured to: control the resonance switch and the current source switch based on the transmission target signal in a transmission mode; and control the resonance switch and the current source switch based on a quenching clock signal in a reception mode.

The wireless communications apparatus may further include an antenna coupled to the oscillator circuit.

According to another general aspect, a wireless communication method includes determining an operation region of a transistor included in an oscillator circuit by adjusting a bias signal in response to an applied signal; and generating, by the oscillator circuit including the transistor operating in the determined operation region, an oscillation signal corresponding to an oscillation frequency determined by an antenna.

The generating, by the oscillator circuit including the transistor operating in the determined operation region, the oscillation signal corresponding to the oscillation frequency determined by the antenna, uses the antenna.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
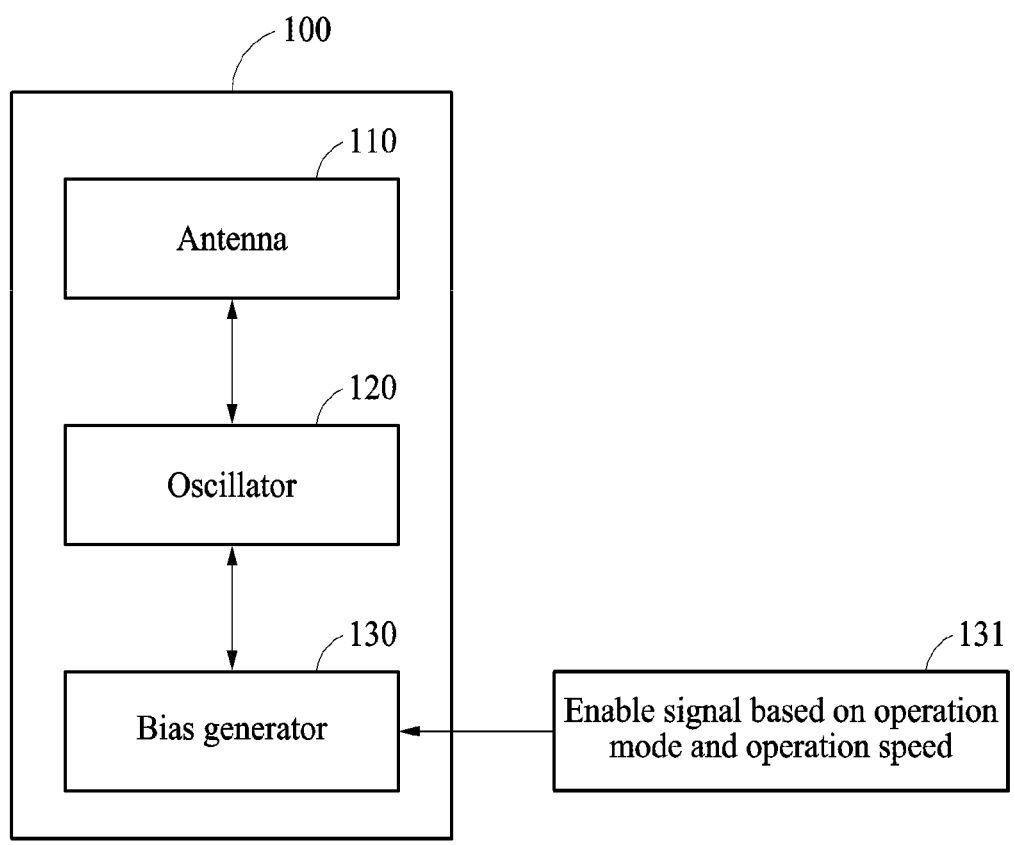
FIG. 1 is a block diagram illustrating an example of a wireless communication apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, embodiments will be described in detail with reference to the accompanying drawings. Like numbers refer to like elements throughout the description of the figures.

It should be understood, however, that there is no intent to limit this disclosure to the particular embodiments disclosed. On the contrary, example embodiments are to cover all modifications, equivalents, and alternatives falling within the scope of the embodiments.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

FIG. 1 is a block diagram illustrating an example of a wireless communication apparatus in accordance with an embodiment.

A wireless communication apparatus 100 includes an antenna 110, an oscillator circuit 120, and a bias generator circuit 130.

The antenna 110 is an element or a circuit configured to transmit a signal to an external area or receive a signal from an external source. The antenna 110 includes at least one capacitor and at least one inductor. The capacitor includes a capacitor bank having a variable capacitance. The antenna 110 is, for example, a circuit configured to transmit or receive a signal having a frequency similar to a resonance frequency determined by either one or both of the capacitor and the inductor. The resonance frequency corresponds to an oscillation frequency of the oscillator circuit 120.

The oscillator circuit 120 is a circuit configured to generated an oscillation signal. For example, the oscillator circuit 120 generates an oscillation signal having an oscillation frequency determined by the antenna 110 using the antenna 110. The wireless communication apparatus 100 generates a data signal to be transmitted to an external area based on the oscillation signal generated by an oscillator or receives a data signal from an external source. In this disclosure, an oscillator circuit is also referred to as an oscillator for ease of description.

The oscillator circuit 120 uses the antenna 110 as a resonance inductor of the oscillator circuit 120. A single oscillator circuit may operate as a power oscillator in a process of transmission and is reconfigured to operate as a super regenerative oscillator (SRO) in a process of reception. Thus, the oscillator circuit 120 is reconfigurable so that it may perform both an operation of an output end associated with a relatively large amount of power and an operation of a receiving end associated with a relatively small amount of input power in a minimized form factor.

A bias generator circuit 130 is a circuit configured to generate a bias signal and apply the generated bias signal. The bias generator circuit 130 changes a region in which an amplifier or a transistor included in the oscillator circuit 120 operates by adjusting the bias signal in response to an enable signal 131. Hereinafter, descriptions will be provided based on an example in which an operation region of a transistor is changed based on a supplied bias signal and embodiments are not limited thereto. The description is also applicable to an example in which an entire amplifier circuit implemented as a transistor or an electronic device changes an operation region. In this disclosure, a bias generator circuit is also referred to as a bias generator for ease of description.

The enable signal 131 is a signal determined based on at least one of an operation mode and an operation speed of the wireless communication apparatus 100. The enable signal 131 includes, for example, a signal used for indicating a transmission mode and a signal used for indicating a reception mode. A process of determining the enable signal 131 will be described in detail later.

A bias signal is a signal applied to the transistor included in the oscillator circuit 120. The bias signal includes, for example, a bias voltage and a bias current. The bias signal may vary based on a class in which the transistor operates.

The operation region of the transistor is classified based on a position of an operating point of a quiescent state in which a signal has not been applied. The operation region of the transistor is determined based on at least one of the bias voltage and the bias current applied to the transistor. The operation region of the transistor is classified into a class A, a class AB, a class B, and a class C based on an amplifiable phase portion of the entire phase, for example, 360 degrees (°) of a signal input to the transistor.

When the transistor operates in the class A mode, the transistor amplifies a signal corresponding to the entire phase of 0° through 360°. For example, the transistor operating in the class A mode operated as a linear amplifier circuit of which an amplification rate is constant irrespective of an intensity of an input signal.

When the transistor operates in the class AB mode, the amplifiable phase of the transistor is greater in a range between 0° and 180°, for example, the class B and less than a range between 0° and 360°, for example, the class A. For example, the transistor operating in the class AB is a transistor operating at an operating point between the class A and the class B.

When the transistor operates in the class B mode, the transistor amplifies a signal corresponding to the entire phase of 0° through 180°. For example, the transistor operating in the class B mode is a transistor of which an operating point is located adjacent to a threshold voltage $V_{th}$ of a characteristic of amplification. The transistor of the class B prevents a current from flowing at an operating point, for example, a quiescent state, at which an alternate current signal is 0. Through this, a power efficiency of the transistor corresponding to the class B is maximized.

When the transistor operates in a class C mode, the transistor amplifies a signal corresponding to a phase less than a phase between 0° and 180°. For example, the transistor operating in the class C is a transistor of which an operating point is a voltage less than the threshold voltage $V_{th}$ of a characteristic of amplification. The transistor operating in the class C amplifies only a portion of waveform of an input signal instead of the entire waveform of the input signal. The transistor operating in the class C mode has a high amplification efficiency even though a waveform distortion may occur therein. When the oscillator circuit 120 operates in the class C mode, power consumption versus output of the oscillator circuit 120 may be improved and phase noise may also be alleviated.

The oscillator circuit 120 of the wireless communication apparatus 100 secures a radio frequency (RF) gain by operating based on at least one of the class A, the class B, and the class AB in the reception mode. Also, the wireless communication apparatus 100 operates in the class C in the transmission mode, thereby achieving a high power efficiency in the transmission mode. For example, when the wireless communication apparatus 100 is in the reception mode, the oscillator circuit 120 responds to an external signal input through the antenna 110 at a low intensity. When the wireless communication apparatus 100 is in the transmission mode, the oscillator circuit 120 transmits a signal to an external area at a low power and a high efficiency and the wireless communication apparatus 100 is minimized. As such, the wireless communication apparatus 100 changes an operation region of the transistor included in the oscillator circuit 120 and a configuration of the oscillator circuit 120, thereby minimizing an amount of power used for transmitting and receiving a signal.

The wireless communication apparatus 100 is applicable to, for example, an RF integrated circuit (IC), a wireless transceiver having a small form factor, a low power transmitter, the Internet of things (IoT) where ordinary, generally, non-computer related things, such as washers, refrigerators, and other devices are harnessed as additional nodes on a communication network such as the internet, or intranets, and a medical implant communications system (MICS).

Figure 2:
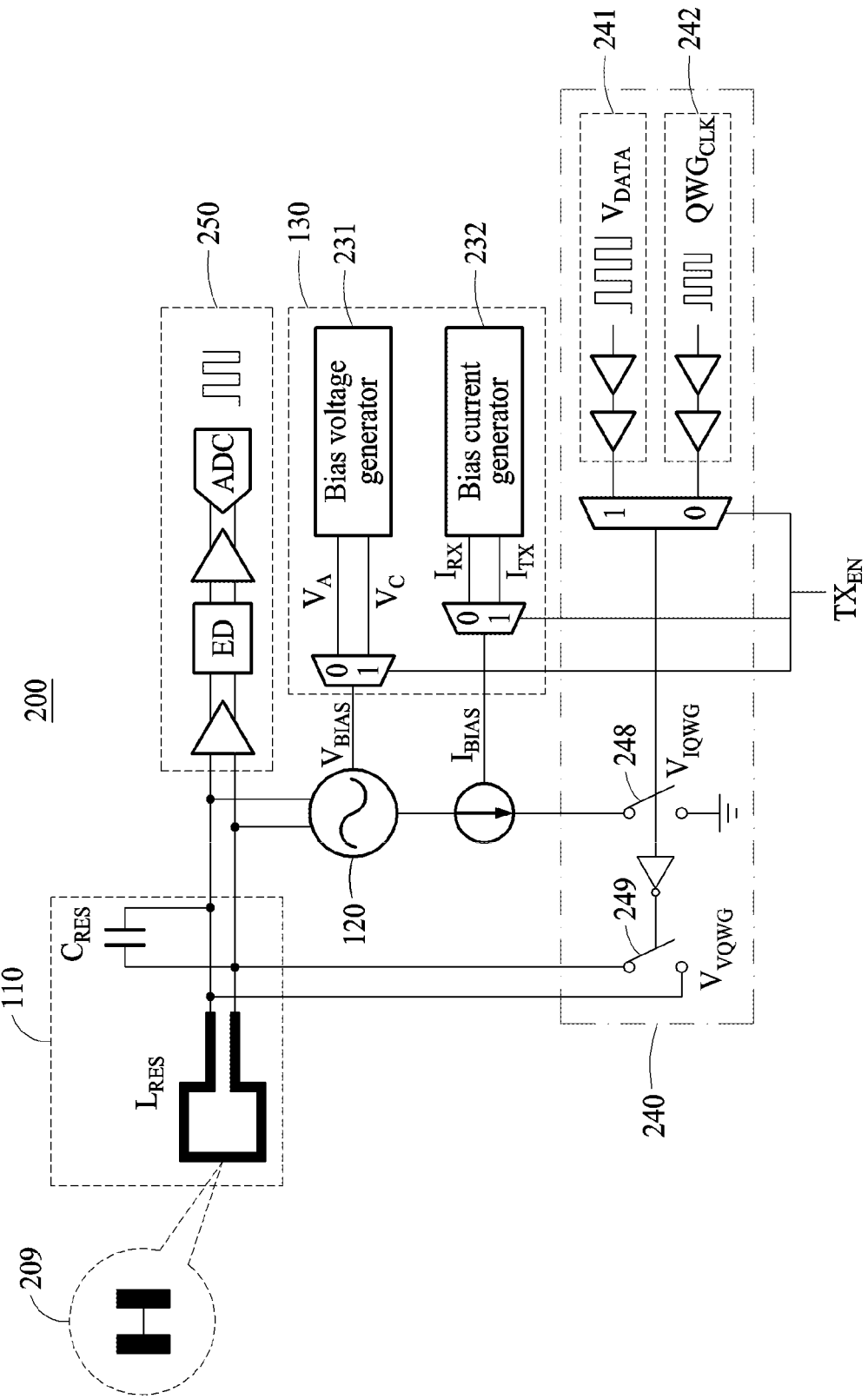
FIG. 2 is a diagram illustrating an example of a wireless communication.

FIG. 2 is a diagram illustrating a wireless communication apparatus in accordance with an embodiment.

A wireless communication apparatus 200 includes the antenna 110, the oscillator circuit 120, the bias generator circuit 130, a transmission route circuit 240, and a reception route circuit 250.

The antenna 110 includes a capacitor $C_{RES}$ and an inductor $L_{RES}$. The capacitor $C_{RES}$ includes, for example, a capacitor bank having a variable capacitance value. An oscillation frequency of the oscillator circuit 120 is determined based on a capacitance value of the capacitor $C_{RES}$ and an inductance value of the inductor $L_{RES}$. The oscillation frequency of the oscillator circuit 120 is, for example, $f_{OSC}=1/(2\pi \sqrt{L_{RES}C_{RES}})$. Each frequency corresponding to the oscillation frequency $f_{osc}$ is, for example, $w_o$.

The bias generator circuit 130 includes a bias voltage generator 231 and a bias current generator 232. Although FIG. 2 illustrates the bias voltage generator 231 and the bias current generator 232 separate from each other, embodiments are not limited thereto. For example, a single bias generator circuit generates a bias voltage $V_{BIAS}$ and a bias current $I_{BIAS}$ and provides the generated bias voltage $V_{BIAS}$ and the generated bias current $I_{BIAS}$ to the oscillator circuit 120.

In an example of FIG. 2, the bias generator circuit 130 generates a bias signal based on a transmission applying signal $TX_{EN}$. The bias generator circuit 130 supplies a first bias voltage $V_A$ and a reception bias current $I_{RX}$ to the oscillator circuit 120 when the transmission applying signal $TX_{EN}$ is low, for example, 0. Also, the bias generator circuit 130 supplies a second bias voltage $V_C$ and a transmission bias current $I_{TX}$ to the oscillator circuit 120 when the transmission applying signal $TX_{EN}$ is high, for example, 1.

In this disclosure, a transmission applying signal $TX_{EN}$ having a value "high" indicates a transmission mode in which the wireless communication apparatus 200 transmits a signal 209 to an external area. Also, a transmission applying signal $TX_{EN}$ having a value "low" indicates a reception mode in which the wireless communication apparatus 200 receives the signal 209 from an external source.

The first bias voltage $V_A$ is, for example, a bias voltage that configures a transistor of the oscillator circuit 120 to operate in a class A. The second bias voltage $V_C$ is, for example, a bias voltage that reconfigures the transistor of the oscillator circuit 120 to operate in a class C. The reception bias current $I_{RX}$ indicates a current flowing from the oscillator circuit 120 to a ground during the reception mode. The transmission bias current $I_{TX}$ indicates a current flowing from the oscillator circuit 120 to the ground during the transmission mode.

The transmission route circuit 240 is a circuit that is activated while the wireless communication apparatus 200 operates in the transmission mode. For example, the transmission route circuit 240 is a circuit that is activated by the wireless communication apparatus 200 to transmit the signal 209 to an external area. In the transmission mode in which, for example, the transmission applying signal $TX_{EN}$ is high, the transmission route circuit 240 controls a resonance switch 249 and a current source switch 248 based on a transmission target signal $V_{DATA}$ 241. In the reception mode, the transmission route circuit 240 controls the resonance switch 249 and the current source switch 248 based on a quenching clock signal $QWG_{CLK}$ 242. Also, the oscillator circuit 120 may perform a high-frequency conversion on the transmission target signal $V_{DATA}$ 241 input through the transmission route circuit 240 to be an oscillation frequency. As a size of a signal component corresponding to the oscillation frequency increases, an intensity of a signal to be transmitted to an external area is increased. Thus, the oscillator circuit 120 operates in the class C mode to amplify an oscillation frequency component, for example, a component corresponding to a fundamental frequency and improve a direct current (DC)-to-RF (DC-to-RF) power efficiency.

The transmission route circuit 240 opens the resonance switch 249 and closes the current source switch 248 during an interval in which the transmission target signal $V_{DATA}$ 241 is valid, for example, an interval in which data is present. Through this, the oscillator circuit 120 oscillates using the antenna 110. Conversely, the transmission route circuit 240 closes the resonance switch 249 and opens the current source switch 248 during an interval in which the transmission target signal $V_{DATA}$ 241 is invalid, for example, an interval in which the data is absent. Through this, the oscillator circuit 120 intelligently prevents oscillation so as to prevent or significantly reduce power consumption.

While the wireless communication apparatus 200 operates in the reception mode, the transmission route circuit 240 operates irrespective of the transmission target signal $V_{DATA}$ 241 and switches on or off the resonance switch 249 and the current source switch 248 based on the quenching clock signal $QWG_{CLK}$ 242. The transmission route circuit 240 opens the resonance switch 249 and closes the current source switch 248 during an interval in which the quenching clock signal $QWG_{CLK}$ 242 is valid. Also, the transmission route circuit 240 closes the resonance switch 249 and opens the current source switch 248 during an interval in which the quenching clock signal $QWG_{CLK}$ 242 is invalid.

The current source switch 248 changes a current of the oscillator circuit 120 based on a current control signal $V_{IQWG}$. The current source switch 248 changes a current flowing to the oscillator circuit 120 in response to the transmission target signal $V_{DATA}$. The resonance switch 249 switches an oscillation or a resonance of the oscillator circuit 120 and the antenna 110 based on a voltage control signal $V_{VQWG}$. The resonance switch 249 switches on or off a connection between both ends of the antenna 110 in response to the transmission target signal $V_{DATA}$. The voltage control signal $V_{VQWG}$ is, for example, an inverse signal of the current control signal $V_{IQWG}$. As illustrated in FIG. 2, the current control signal $V_{IQWG}$ may be the transmission target signal $V_{DATA}$ 241 in the transmission mode and may be the quenching clock signal $QWG_{CLK}$ 242 in the reception mode.

The reception route circuit 250 is a circuit that is activated while the wireless communication apparatus 200 operates in the reception mode. Also, the reception route circuit 250 is a circuit that is activated by the wireless communication apparatus 200 to receive the signal 209 from an external source. When the reception route circuit 250 is activated, the oscillator circuit 120 operates in a class A mode to amplify an RF signal of a relatively low intensity received from an external source. Also, in response to the oscillator circuit 120 operating based on the quenching clock signal $QWG_{CLK}$ 242, the wireless communication apparatus 200 quenches an RF-modulated signal received from the external source, thereby improving a receiving sensitivity and a response time. For example, the oscillator circuit 120 operating based on the quenching clock signal $QWG_{CLK}$ 242 starts oscillating in response to the signal 209 having a frequency similar to an oscillation frequency being received from the external source.

The reception route circuit 250 includes an envelope detector (ED) configured to detect an envelope of the signal 209 received from an external source and an analog-to-digital converter (ADC) configured to convert the detected envelope into a digital signal. In the reception mode, the wireless communication apparatus 200 receives the signal 209 using the antenna 110, the oscillator circuit 120, and the reception route circuit 250, and is reconfigured to operate as a super-regenerative receiver (SRR).

Figure 3:
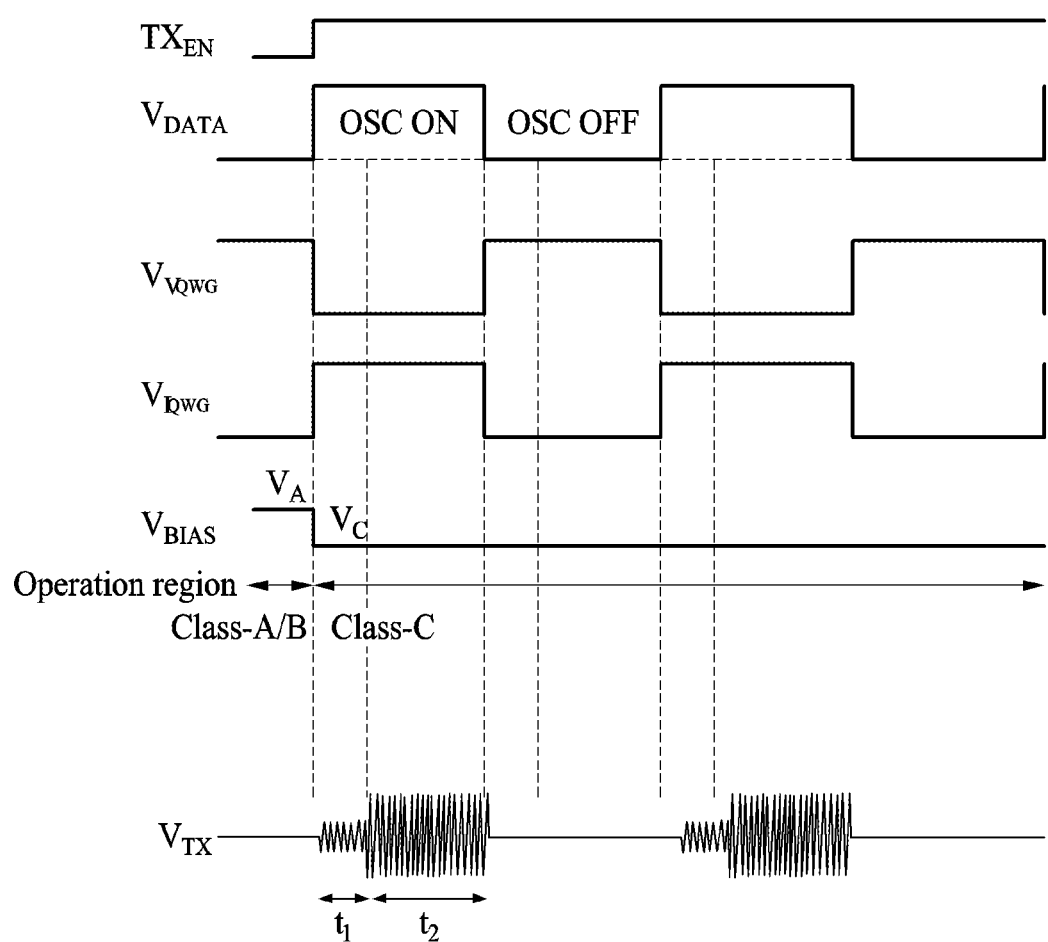
FIG. 3 is a diagram illustrating an example of an operation of a wireless communication apparatus.

FIG. 3 is a diagram illustrating an example of an operation of a wireless communication apparatus in accordance with an embodiment.

FIG. 3 illustrates an example of an operation of the wireless communication apparatus, such as the one shown in FIG. 2 in a case in which the wireless communication apparatus enters a transmission mode. When the transmission applying signal $TX_{EN}$ corresponding to a high state is applied, the wireless communication apparatus generates the current control signal $V_{IQWG}$ and the voltage control signal $V_{VQWG}$ based on the transmission target signal $V_{DATA}$. As discussed above, an oscillation may be performed in an interval in which the transmission target signal $V_{DATA}$ is high, which may be represented as "OSC ON" in FIG. 3. Also, the oscillation may be suspended in an interval in which the transmission target signal $V_{DATA}$ is low, which may be represented as "OSC OFF" in FIG. 3. The current control signal $V_{IQWG}$ may be identical to the transmission target signal $V_{DATA}$. The voltage control signal $V_{VQWG}$ is, for example, an inverse signal of the transmission target signal $V_{DATA}$.

In a state in which the transmission applying signal $TX_{EN}$ is low, for example, in a reception mode, a bias generator circuit of the wireless communication apparatus generates the first bias voltage $V_A$. In a state in which the transmission applying signal $TX_{EN}$ is high, for example, in the transmission mode, the bias generator circuit of the wireless communication apparatus generates the second bias voltage $V_C$. Thus, the wireless communication apparatus configures a transistor of an oscillator circuit to operate in a class A in the reception mode and adaptively reconfigures the transistor to operate in a class C in the transmission mode for selectively amplification and power savings. An operation region of the transistor in reception mode is not limited to the foregoing example and thus, the wireless communication apparatus operating in the reception mode also allows the transistor of the oscillator circuit to operate in one of the class A, a class B, and a class AB, according to one or more embodiments.

A transient state interval $t_1$ indicates a time used for a startup of the oscillator circuit. The startup may be a preparation operation for an oscillation of the oscillator circuit. The wireless communication apparatus generates a signal to be transmitted to an external area at a normal intensity during a steady state interval $t_2$. A technique to minimize the transient state interval $t_1$ is beneficially employed in an environment in which a power efficiency and a high data transmission rate are required.

Figure 4:
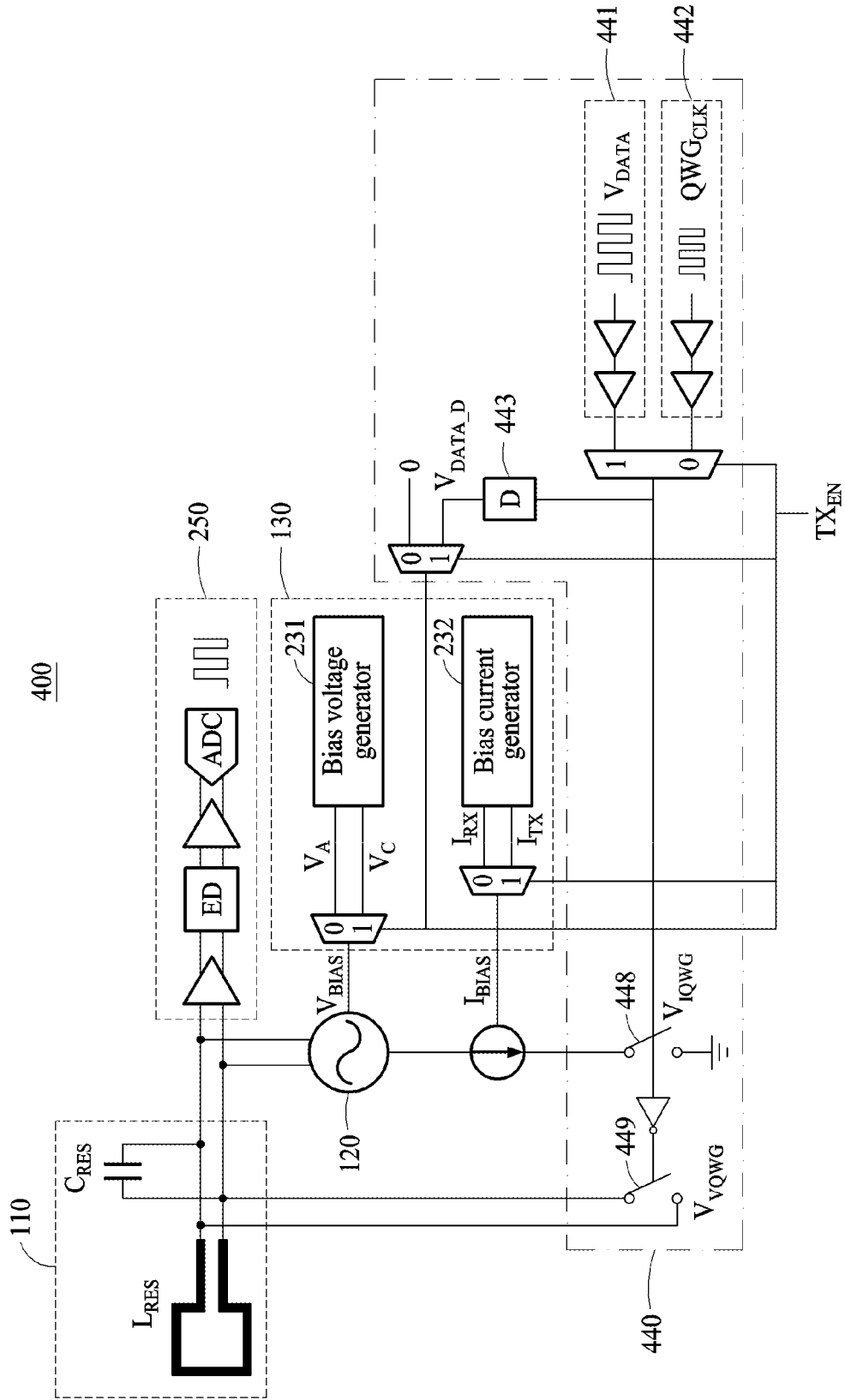
FIG. 4 is a diagram illustrating an example of a wireless communication apparatus.

FIG. 4 is a diagram illustrating a wireless communication apparatus in accordance with an embodiment.

Referring to FIG. 4, a wireless communication apparatus 400 includes the antenna 110, the oscillator circuit 120, the bias generator circuit 130, and the reception route circuit 250, similarly to the wireless communication apparatus 200 of FIG. 2.

Similarly to the example of FIG. 2, a transmission route circuit 440 of the wireless communication apparatus 400 uses a transmission target signal $V_{DATA}$ 441 when the transmission applying signal $TX_{EN}$ is high and uses a quenching clock signal $QWG_{CLK}$ 442 when the transmission applying signal $TX_{EN}$ is low. The wireless communication apparatus 400 controls a current source switch 448 and a resonance switch 449 based on the transmission target signal $V_{DATA}$ 441 or the quenching clock signal $QWG_{CLK}$ 442.

The transmission route circuit 440 further includes a delay circuit 443. The delay circuit 443 provides the transmission target signal $V_{DATA\_D}$ generated by delaying a transmission target signal $V_{DATA}$ 441 to the bias generator circuit 130 in response to the wireless communication apparatus 400 entering a transmission mode. In the transmission mode, the delay circuit 443 delays the transmission target signal $V_{DATA}$ 441 by a predetermined delay time $\Delta t_d$ to generate the transmission target signal $V_{DATA\_D}$. The delay circuit may contain components known to one of skill in the art after gaining a thorough understanding of the subject disclosure. Such components may include capacitors, inductors, resistors, transistors, buffers, and the like.

In response to the delayed transmission target signal $V_{DATA\_D}$, the bias generator circuit 130 generates bias signals $V_{BIAS}$ and $I_{BIAS}$ and provides the bias signals $V_{BIAS}$ and $I_{BIAS}$ to the oscillator circuit. For example, the bias voltage generator 231 of the bias generator circuit 130 applies the second bias voltage $V_C$ to a gate node of a transistor included in the oscillator circuit in response to the delayed transmission target signal $V_{DATA\_D}$. Thus, the bias voltage generator 231 provides the first bias voltage $V_A$ to the oscillator circuit 120 during the delay time $\Delta t_d$ after the transmission applying signal $TX_{EN}$ is applied. Also, after the delay time $\Delta t_d$ elapses from a point in time at which the transmission applying signal $TX_{EN}$ is applied, the bias voltage generator 231 provides the second bias voltage $V_C$ to the oscillator circuit 120.

Figure 5:
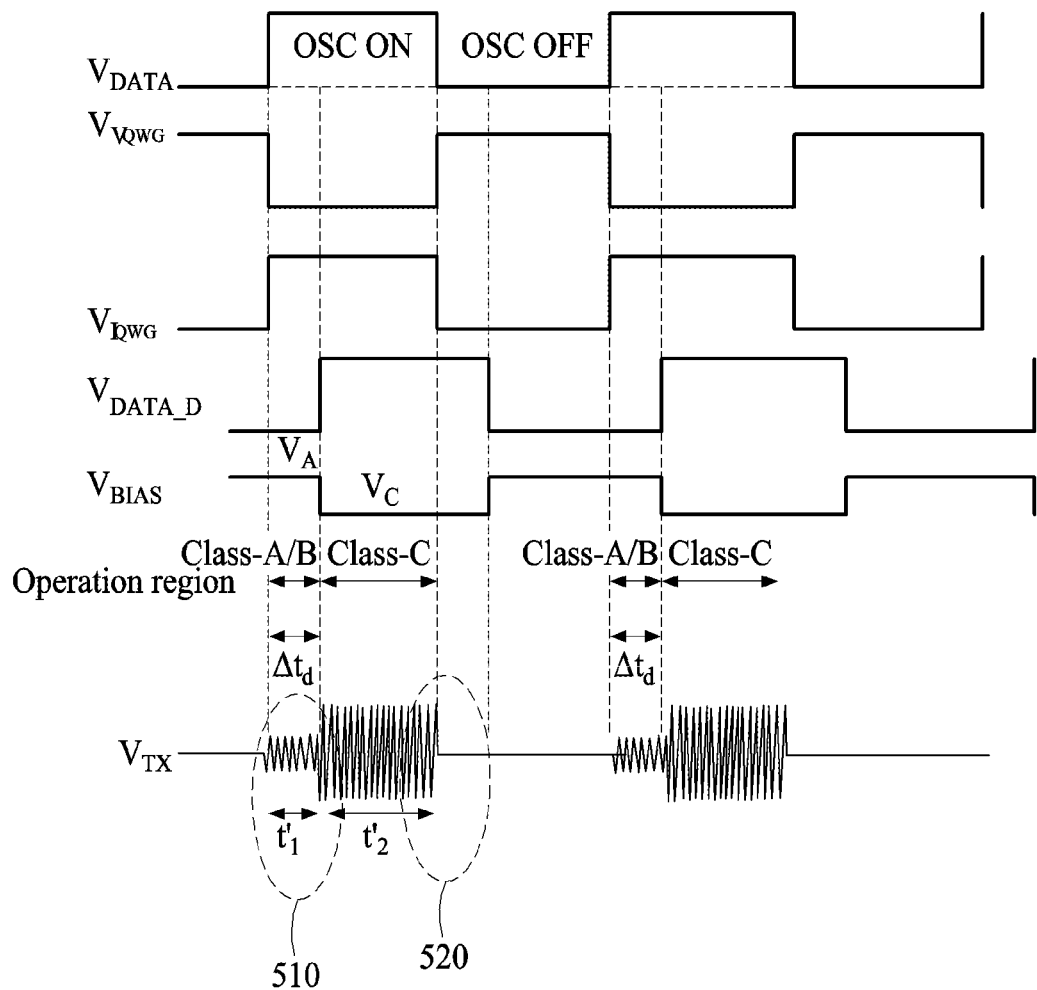
FIG. 5 is a diagram illustrating an example of an operation of a wireless communication apparatus.

FIG. 5 is a diagram illustrating an example of an operation of a wireless communication apparatus in accordance with an embodiment.

FIG. 5 illustrates an example of controlling a bias voltage $V_{BIAS}$ of an oscillator circuit using a delayed transmission target signal $V_{DATA\_D}$ generated by delaying a transmission target signal for a predetermined delay time $\Delta t_d$ in response to the wireless communication apparatus of FIG. 4 entering a transmission mode.

The wireless communication apparatus generates the current control signal $V_{IQWG}$ to correspond to substantially the same timing as the transmission target signal $V_{DATA}$, and generates the voltage control signal $V_{VQWG}$ based on an inverse signal of the transmission target signal $V_{DATA}$.

As illustrated in FIG. 5, the wireless communication apparatus generates the delayed transmission target signal $V_{DATA\_D}$ and generates the bias voltage $V_{BIAS}$ based on the delayed transmission target signal $V_{DATA\_D}$. For example, while the transmission target signal $V_{DATA\_D}$ is in a low state, the wireless communication apparatus applies the first bias voltage $V_A$ to an oscillator circuit as the bias voltage $V_{BIAS}$. When the delayed transmission target signal $V_{DATA\_D}$ enters a high state, the wireless communication apparatus applies the second bias voltage $V_C$ to the oscillator circuit as the bias voltage $V_{BIAS}$. Since the delayed transmission target signal $V_{DATA\_D}$ is a signal delayed by the delay time $\Delta t_d$, a transistor of the oscillator circuit operates, for example, in a class AB mode during the delay time $\Delta t_d$ after the wireless communication apparatus enters a transmission mode. However, a type of class is not limited to the class AB and thus, the oscillator circuit may also operate in a class A or a class B. After the delay time $\Delta t_d$ elapses, the transistor of the oscillator operates in a class C mode.

A bias generator circuit applies the first bias voltage $V_A$ to the transistor in a transient state interval $t'_1$ in the transmission mode. Also, the bias generator circuit applies the second bias voltage $V_C$ to the transistor in a steady state interval $t'_2$ after the transient state interval $t'_1$ elapses. Thus, the oscillator circuit operates in the class AB mode based on the first bias voltage $V_A$ in the transient state interval $t'_1$ for each process of transmitting the transmission target signal. Also, the oscillator circuit operates in the class C mode based on the second bias voltage $V_C$ in the steady state interval $t'_2$.

The transistor of the oscillator circuit included in the wireless communication apparatus is started up in the transient state interval $t'_1$. The oscillator circuit operates to generate a signal to be transmitted to an external area at a normal amplitude in the steady state interval $t'_2$. In an example of FIG. 5, the wireless communication apparatus dynamically adjusts the bias voltage $V_{BIAS}$ applied to the transistor of the oscillator circuit through a delay circuit in the transmission mode so as to reduce the transient state interval $t'_1$ in comparison to the transient state interval $t_1$ of FIG. 3. By reducing the transient state interval the wireless communication apparatus realizes a fast startup 510 and realizes a high efficiency of transmission power.

Also, the wireless communication apparatus stably terminates an oscillation of the signal transmitted to an external area at a point in time at which the transmission target signal $V_{DATA}$ is to be low based on the current control signal $V_{IQWG}$ and the voltage control signal $V_{VQWG}$ so as to remove a lagging residual inefficiency 520 of the oscillation.

Figure 6:
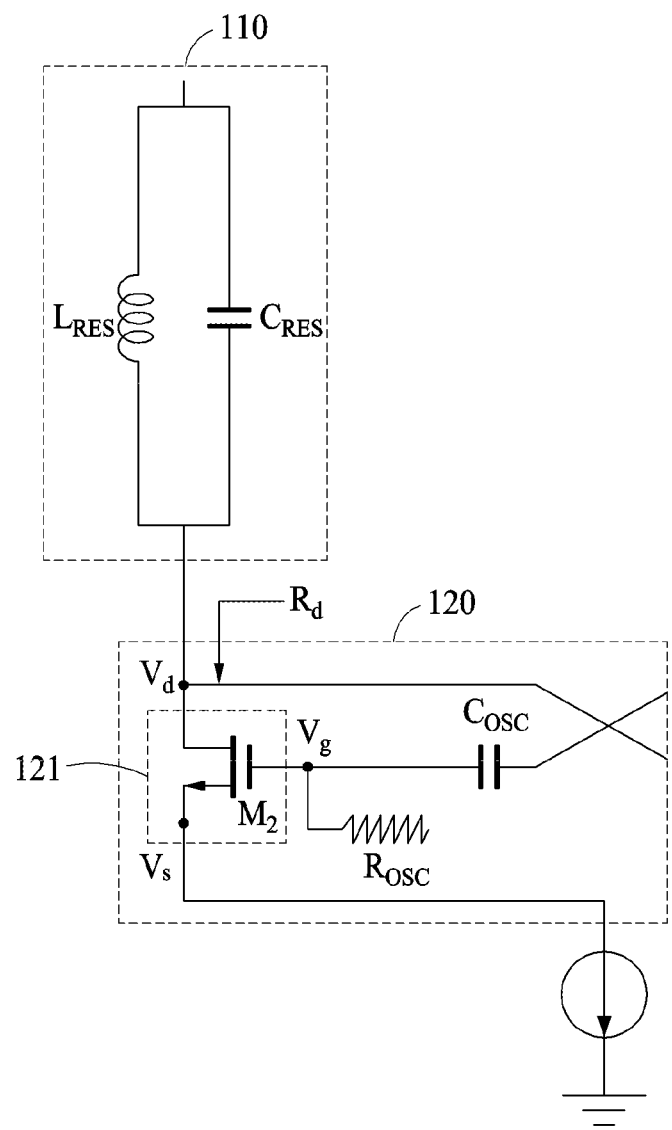
FIG. 6 is a diagram illustrating an example of an operation of an oscillator circuit included in a wireless communication apparatus.

FIG. 6 is a diagram illustrating an operation of an oscillator circuit included in a wireless communication apparatus in accordance with an embodiment.

FIG. 6 illustrates a half circuit of the oscillator circuit 120 connected to the antenna 110 to perform an oscillation. The antenna 110 includes an inductor $L_{RES}$ and a capacitor $C_{RES}$ connected in parallel.

The oscillator circuit 120 includes a transistor pair including two transistors connected to each other. The transistor pair also includes the capacitor $C_{OSC}$ connecting a gate node of one transistor, for example, $M_2$ of the two transistors and a drain node of the other transistor, and a resistor $R_{OSC}$ connecting the gate node of one transistor, for example, $M_2$ of the two transistors and a gate node of the other transistor. When a transistor, for example, $M_2$ (as seen, for example, in FIG. 7) included in the oscillator circuit 120 operates in a deep triode region, a resistor $R_{ON}$ may be present as a resistor between a drain node and a source node in a region 121 between a drain and a source of a transistor.

Figure 7:
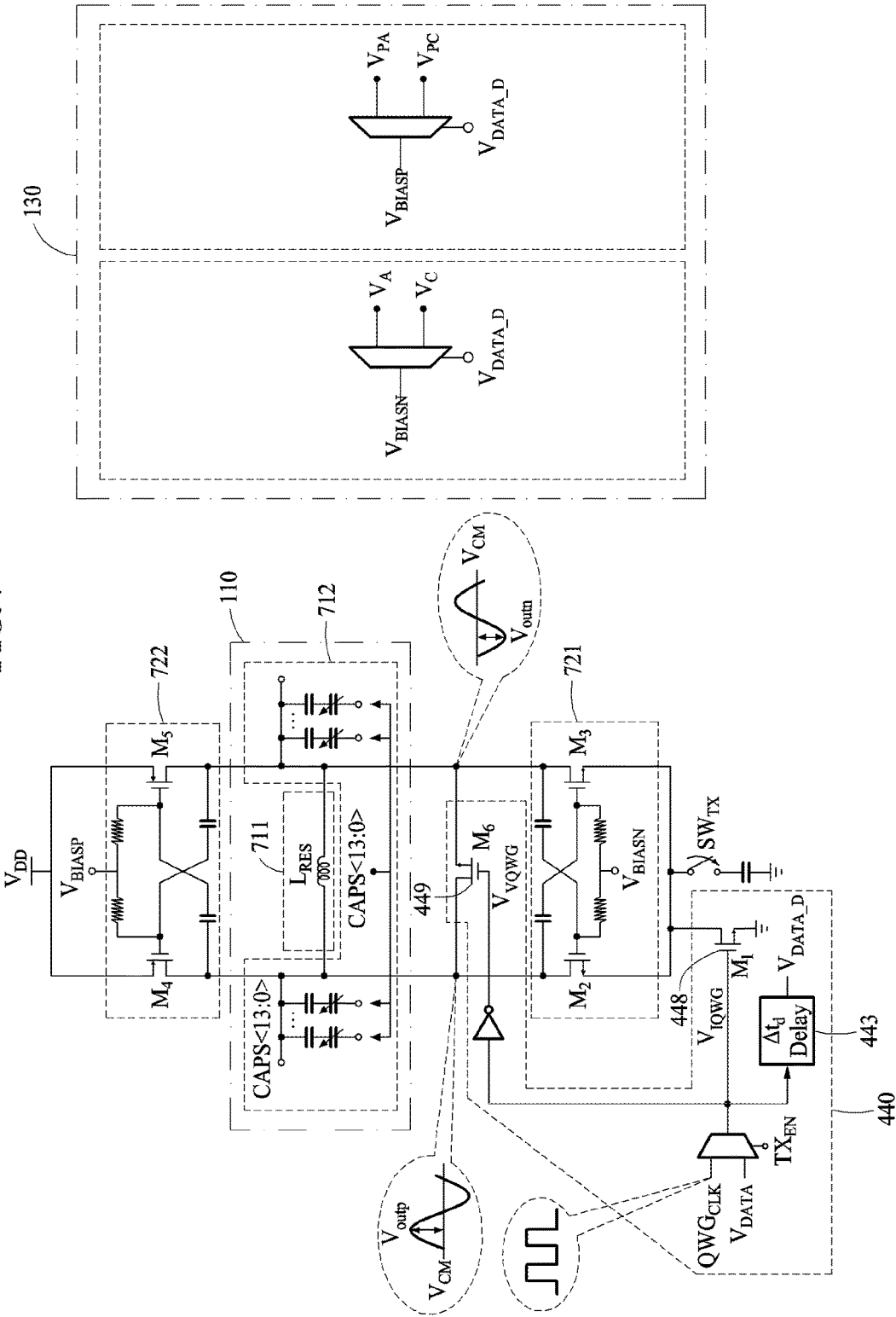
FIG. 7 is a diagram illustrating an example of a wireless communication apparatus.

FIG. 7 is a diagram illustrating a wireless communication apparatus in accordance with an embodiment.

FIG. 7 illustrates a circuit of the wireless communication apparatus of FIG. 4. The antenna 110 includes one or more inductors $L_{RES}$ 711 and one or more capacitors 712. The capacitor 712, in this example, includes a capacitor bank. A capacitance value of the capacitor bank is controlled based on a control code.

An oscillator circuit includes, for example, two transistor pairs. In an example of FIG. 7, the oscillator circuit includes a first transistor pair 721 and a second transistor pair 722.

A transistor pair included in the oscillator circuit operates as a negative resistance generator circuit and is implemented as, for example, a cross-connected pair. In terms of an N-type metal-oxide-semiconductor (NMOS) transistor, a voltage applied to a gate node of a transistor in the transistor pair is set to be lower than a common mode voltage of an output signal. In terms of a P-type metal-oxide-semiconductor (PMOS) transistor, the voltage applied to the gate node of the transistor in the transistor pair is set to be higher than the common mode voltage of the output signal.

The first transistor pair 721 includes two NMOS transistors $M_2$ and $M_3$ connected to each other to oscillate using a resistor and a capacitor. When receiving the bias signal $V_{BIASN}$, the first transistor pair 721 operates in a region corresponding to a voltage of the bias signal $V_{BIASN}$. The voltage of the bias signal $V_{BIASN}$ is determined to be the second bias voltage $V_C$ in a transmission mode and determined to be the first bias voltage $V_A$ in a reception mode. As illustrated in the bias generator circuit 130 of FIG. 7, the bias signal $V_{BIASN}$ is an output signal, for example, $V_A$ or $V_C$ of a multiplexer (MUX) determined based on an operation mode and an operation speed of the wireless communication apparatus. The bias generator circuit 130 applies the first bias voltage $V_A$ to the transistors $M_2$ and $M_3$ in the reception mode and applies the second bias voltage $V_C$ that is different from the first bias voltage $V_A$ to the transistors $M_2$ and $M_3$ in the transmission mode. For example, the second bias voltage $V_C$ corresponding to the first transistor pair 721 is lower than the first bias voltage $V_A$.

The second transistor pair 722 includes, for example, two PMOS transistors $M_4$ and $M_5$ connected to each other to oscillate using a resistor and a capacitor. When receiving the bias signal $V_{BIASP}$, the second transistor pair 722 operates in a region corresponding to a voltage of the bias signal $V_{BIASP}$. The voltage of the bias signal $V_{BIASP}$ is determined to be the second bias voltage $V_{PC}$ in the transmission mode and determined to be the first bias voltage $V_{PA}$ in the reception mode. As illustrated in the bias generator circuit 130 of FIG. 7, the bias signal $V_{BIASP}$ is an output signal, for example, $V_{PA}$ or $V_{PC}$ of an MUX determined based on an operation mode and an operation speed of the wireless communication apparatus. Also, the wireless communication apparatus may supply a supply power $V_{DD}$ to the second transistor pair 722. The bias generator circuit 130 applies the first bias voltage $V_{PA}$ to the transistors $M_4$ and $M_5$ in the reception mode and applies the second bias voltage $V_{PC}$ that is different from the first bias voltage $V_{PA}$ to the transistors $M_4$ and $M_5$ in the transmission mode. For example, the second bias voltage $V_{PC}$ corresponding to the second transistor pair 722 is higher than the first bias voltage $V_{PA}$.

In the reception mode, the bias generator circuit 130 determines a magnitude of a first bias voltage based on a common mode voltage of an output signal. For example, the bias generator circuit 130 determines the first bias voltage such that the first bias voltage is identical or similar in magnitude to the common mode voltage of the output signal. Through this, the oscillator circuit 120 receives the same voltage as the common mode voltage. In the reception mode, the bias generator circuit 130 determines the first bias voltage $V_A$ of the bias signal $V_{BIASN}$ corresponding to the first transistor pair 721 to be, for example, $V_{BIASN}-V_{CM} \approx 0$. Also, in the reception mode, the bias generator circuit 130 determines the first bias voltage $V_{PA}$ of the bias signal $V_{BIASP}$ corresponding to the second transistor pair 722 to be, for example, $V_{BIASP}-V_{CM} \approx 0$.

In the transmission mode, the bias generator circuit 130 determines a magnitude of the second bias voltage $V_C$ of the bias signal $V_{BIASN}$ corresponding to the first transistor pair 721 based on a common mode voltage $V_{CM}$ of an output signal, a differential voltage $A_T$ of the output signal, and a threshold $V_{THN}$ of a transistor. The bias generator circuit 130 determines the magnitude of the second bias voltage $V_C$ corresponding to the first transistor pair 721 to be, for example, $V_{BIASN} < V_{CM} - A_T + V_{THN}$. In this example, $A_T$ denotes an output amplitude and is obtained using, for example, $V_{outp}-V_{outn}$. The bias generator circuit 130 determines the second bias voltage $V_C$ corresponding to the first transistor pair 721 using the aforementioned equation so as to configure the NMOS transistor of the oscillator circuit 120 to operate in, for example, a saturation region.

Also, the bias generator circuit 130 determines a magnitude of the second bias voltage $V_{PC}$ of the bias signal $V_{BIANSP}$ corresponding to the second transistor pair 722 based on the common mode voltage $V_{CM}$ of the output signal, the differential voltage $A_T$ of the output signal, and the threshold $V_{THN}$ of the transistor. The bias generator circuit 130 determines the magnitude of the second bias voltage $V_{PC}$ corresponding to the second transistor pair 722 to be, for example, $V_{BIASP} < V_{CM} - A_T + |V_{THP}|$. The bias generator circuit 130 determines the second bias voltage $V_{PC}$ corresponding to the second transistor pair 722 using, for example, the aforementioned equation, according to embodiments, so as to allow the PMOS transistor of the oscillator circuit 120 to operate in the saturation region.

The transmission route circuit 440 includes a current power switch $M_1$ 448, a resonance switch $M_6$ 449, and the delay circuit 443. Since the description of FIG. 4 is applicable here, repeated description with respect to operations of the current power switch $M_1$ 448, the resonance switch $M_6$ 449, and the delay circuit 443 will be omitted. Both ends of the resonance switch $M_6$ 449 correspond to a differential voltage corresponding to a signal to be transmitted to an external area. For example, a voltage of one end of the resonance switch $M_6$ 449 is obtained using $V_{outp}+V_{CM}$ and a voltage of the other end is obtained using $V_{outn}+V_{CM}$.

Also, in response to the wireless communication apparatus entering the transmission mode, a transmission switch $SW_{TX}$ connects a capacitor to a source node of the transistor included in the oscillator circuit. In this example, the source node of the transistor included in the oscillator circuit is connected to a ground via the capacitor.

Figure 8:
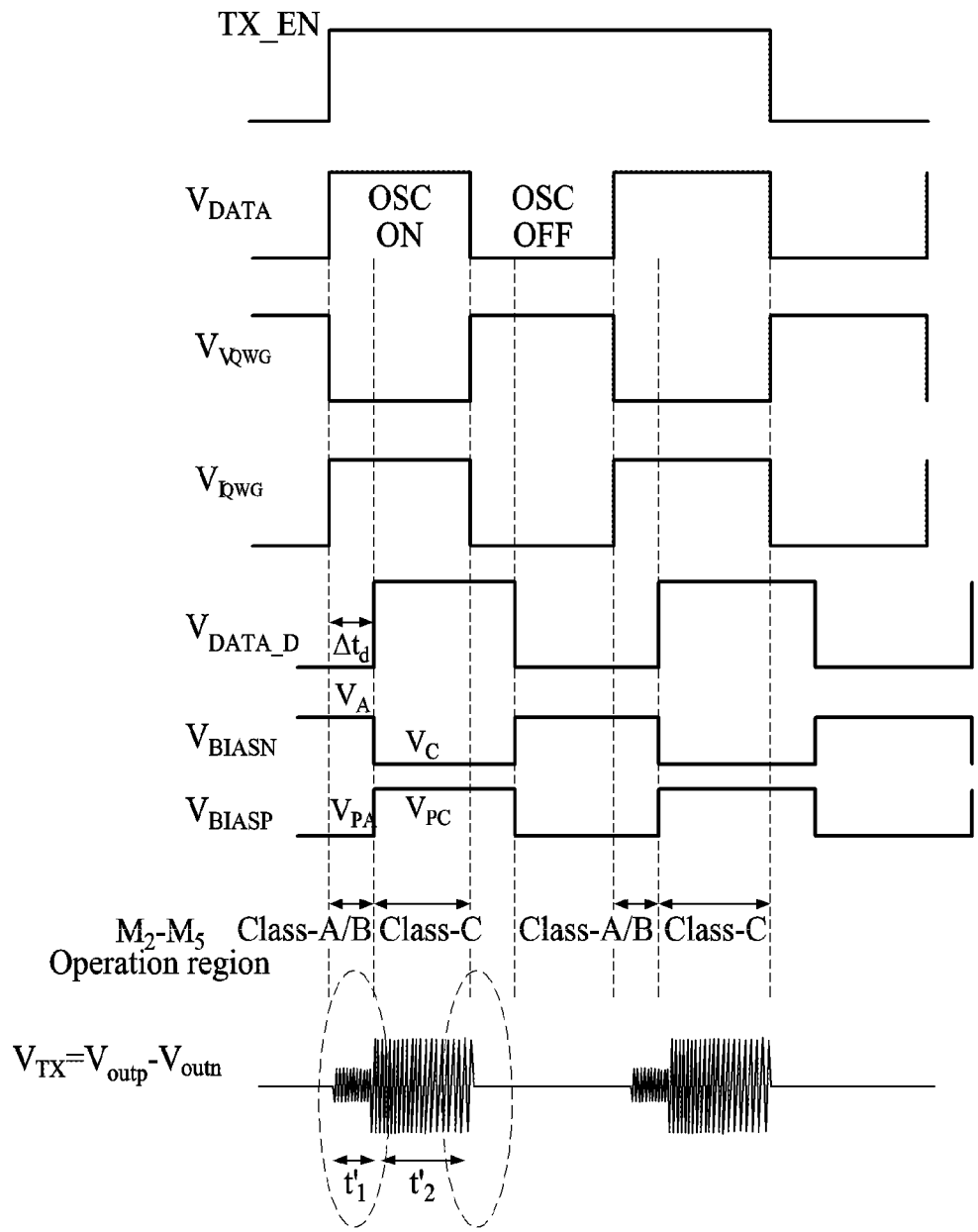
FIG. 8 is a diagram illustrating an example of an operation of the wireless communication apparatus, such as the one of FIG. 7.

FIG. 8 is a diagram illustrating an example of an operation of a wireless communication apparatus, such as the one illustrated in FIG. 7.

FIG. 8 illustrates an example of controlling bias signals $V_{BIASN}$ and $V_{BIASP}$ of the oscillator circuit using a delayed transmission target signal $V_{DATA\_D}$ generated by delaying a transmission target signal for a delay time $\Delta t_d$ in response to the wireless communication apparatus of FIG. 7 entering a transmission mode. In FIG. 8, the transmission target signal $V_{DATA}$, the current control signal $V_{IQWG}$, the voltage control signal $V_{VQWG}$, and the delayed transmission target signal $V_{DATA\_D}$ may be the same, or similar to, those of FIG. 5.

The wireless communication apparatus generates a bias voltage of the bias signal $V_{BIASN}$ supplied to a first transistor pair and a bias voltage of the bias signal $V_{BIASP}$ supplied to a second transistor pair based on the delayed transmission target signal $V_{DATA\_D}$.

Transistors, for example, $M_2$, $M_3$, $M_4$, and $M_5$ of the first transistor pair and the second transistor pair apply first bias voltages $V_A$ and $V_{PA}$ to the first transistor pair and the second transistor pair in the transient state interval after entering a transmission mode. After the transient state interval elapses, the transistors apply second bias voltage $V_C$ and $V_{PC}$ to the first transistor pair and the second transistor pair in the steady state interval $t'_2$.

Through this, the first transistor pair and the second transistor pair of the oscillator circuit in the wireless communication apparatus are started up in the transient state interval $t'_1$ and operate to generate a signal $V_{TX}$ to be transmitted to an external area at a normal amplitude in the steady state interval $t'_2$. In this example, the signal $V_{TX}$ is obtained using $V_{outp}-V_{outn}$. The wireless communication apparatus allows the oscillator circuit to operate in one of a class A, a class B, and a class AB in an initial interval during which the transmission target signal $V_{DATA}$ is high.

An oscillation interval ratio T is represented as, for example, $T=t'_2/(t'_1+t'_2)$. As the oscillation interval ratio increases, the transient state interval $t'_1$ is minimized and thus, an output efficiency is significantly improved. The wireless communication apparatus dynamically adjusts the oscillation interval ratio based on, for example, a signal status.

Figure 9:
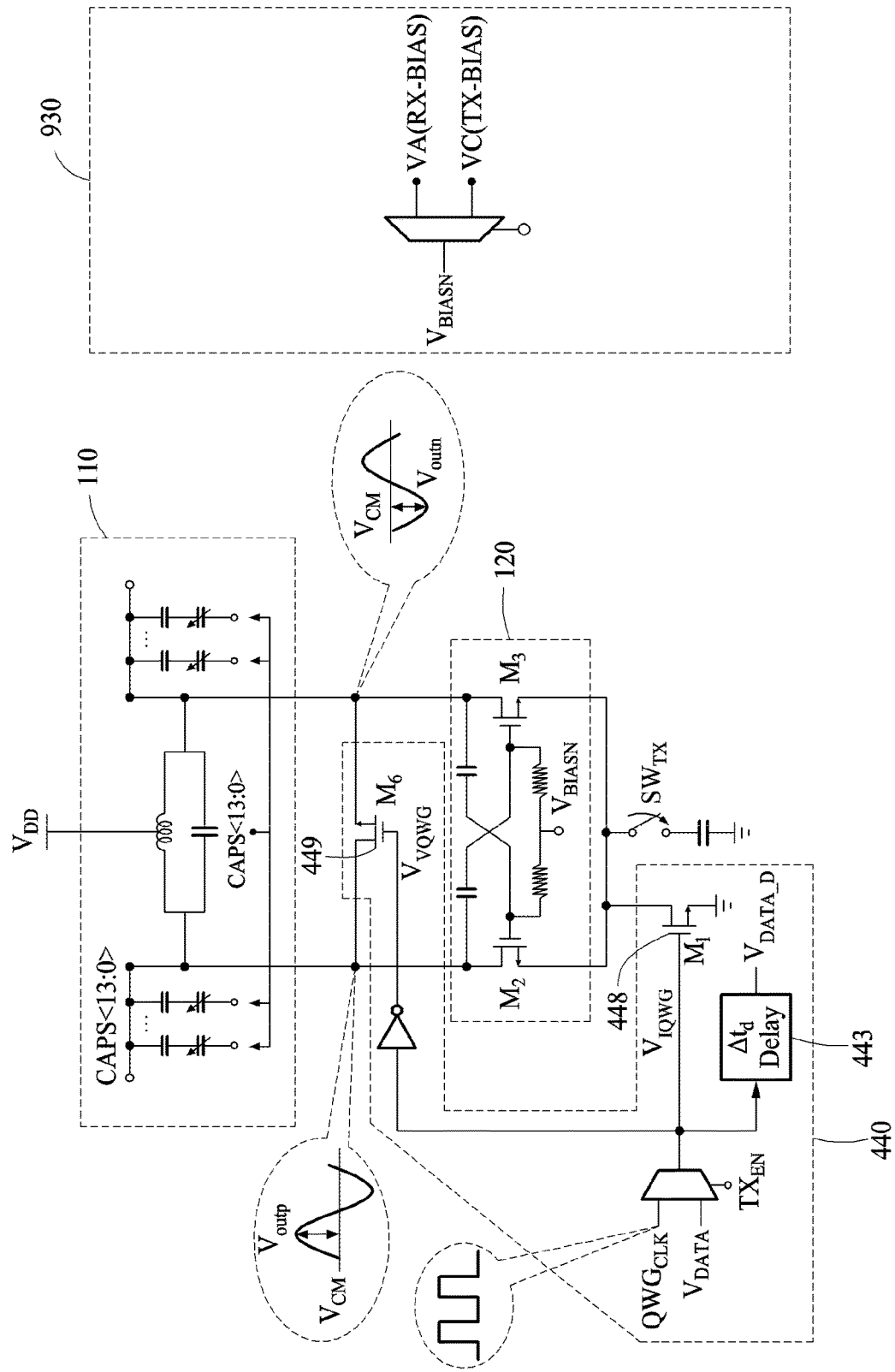
FIG. 9 is a diagram illustrating an example of a wireless communication apparatus.

FIG. 9 is a diagram illustrating an example of a wireless communication apparatus in accordance with an embodiment.

FIG. 9 illustrates a circuit of a wireless communication apparatus, such as the one of FIG. 2. The antenna 110 includes, for example, the capacitor $C_{RES}$, the inductor $L_{RES}$, and a capacitor bank.

The oscillator circuit 120 includes a transistor pair including two transistors $M_2$ and $M_3$.

The transmission route circuit 440 generates the voltage control signal $V_{VQWG}$ and the current control signal $V_{IQWG}$ based on either the transmission target signal $V_{DATA}$ or the quenching clock signal $QWG_{CLK}$ in response to the transmission applying signal $TX_{EN}$. The transmission route circuit 440 controls the resonance switch $M_6$ 449 based on the voltage control signal $V_{VQWG}$ and controls the current source switch $M_1$ 448 based on the current control signal $V_{IQWG}$. The transmission route circuit 440 also includes the delay circuit 443 configured to delay the transmission target signal $V_{DATA}$.

A bias generator circuit 930 generates a bias signal $V_{BIASN}$ as an output signal of a multiplexer selected based on an operation mode and an operation speed of the wireless communication apparatus. In response to the wireless communication apparatus entering a transmission mode, the bias generator circuit 930 determines the bias signal $V_{BIASN}$ to be, for example, $V_{BIASN} < V_{DD} - A_T + |V_{THN}|$, where $V_{DD}$ denotes a voltage of a supply power supplied to the wireless communication apparatus, $A_T$ denotes an amplitude of a signal to be transmitted to an external area, and $V_{THN}$ denotes a threshold voltage of the transistors $M_2$ and $M_3$ included in the oscillator circuit 120.

Since the descriptions of FIGS. 1 through 8 are also applicable here, repeated description of the FIGS. will be omitted for clarity and conciseness.

Figure 10:
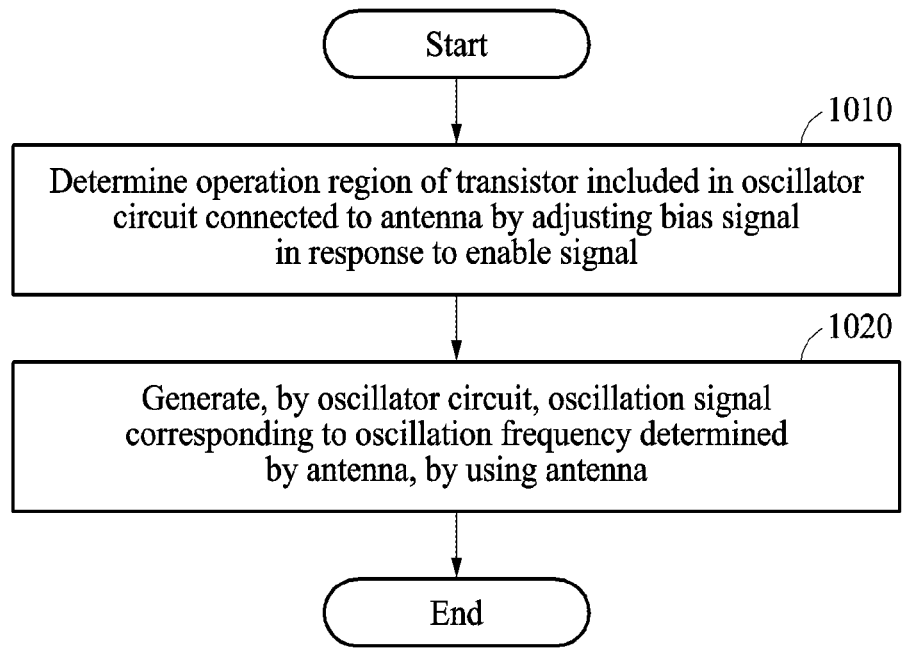
FIGS. 10 and 11 illustrate examples of a wireless communication method.
Figure 11:
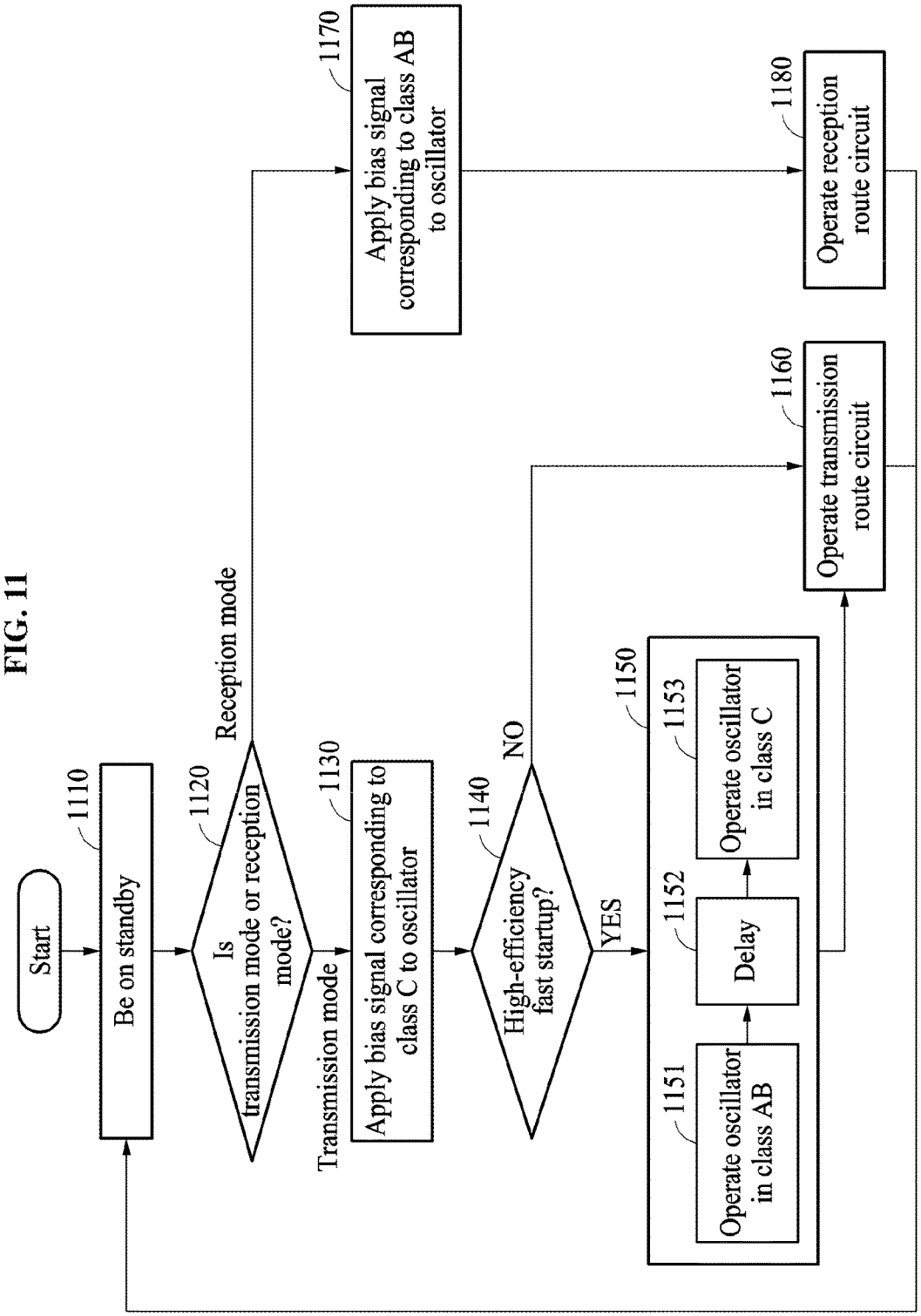

FIGS. 10 and 11 illustrate examples of a wireless communication method.

FIG. 10 is a flowchart illustrating an example of a wireless communication method.

In operation 1010, a wireless communication apparatus determines an operation region of a transistor included in the oscillator circuit connected to an antenna by adjusting a bias signal in response to an enable signal.

In operation 1020, by using the antenna, the oscillator circuit of the wireless communication apparatus generates an oscillation signal corresponding to an oscillation frequency determined by, for example, any one or any two or more of the geometry, the material, and the operational characteristics of the antenna. In this example, the oscillator circuit includes the transistor that operates in the determined operation region.

FIG. 11 is a flowchart illustrating an example of a wireless communication method.

In operation 1110, a wireless communication apparatus is in a standby state. For example, the wireless communication apparatus is in standby until an operational mode is determined.

In operation 1120, the wireless communication apparatus determines whether the mode is a transmission mode or a reception mode. The wireless communication apparatus determines the mode based on a transmission enable signal.

In operation 1130, the wireless communication apparatus applies a bias signal corresponding to a class C to an oscillator in response to the wireless communication apparatus entering the transmission mode.

In operation 1140, the wireless communication apparatus determines whether a high-efficiency fast startup is set.

In operation 1150, when the fast startup is set, the wireless communication apparatus dynamically supplies the bias signal. The wireless communication apparatus applies the bias signal such that the oscillator operates in a class AB mode in operation 1151. In operation 1152, the wireless communication apparatus delays a transmission target signal. Also, the wireless communication apparatus adjusts the bias signal such that the oscillator operates in a class C mode in operation 1153.

In operation 1160, the wireless communication apparatus operates a transmission route circuit to transmit the transmission target signal to an external area such as, for example, a suitably configured receiver device or devices.

When entering the reception mode, the wireless communication apparatus applies a bias signal corresponding to a class AB to the oscillator in operation 1170. In operation 1180, the wireless communication apparatus operates a reception route circuit to receive a signal from an external source such as, for example, an external transmitting device or devices.

Operations of the wireless communication apparatus are not limited to the examples of FIGS. 10 and 11 and may be combined with the operations described with reference to FIGS. 1 through 9.

The wireless communication apparatus beneficially provides high power and high power efficiency characteristics in the transmission mode and a low power and high signal gain characteristics in the reception mode.

The wireless communication apparatus and components thereof in FIGS. 1-11 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, oscillators, signal generators, inductors, capacitors, buffers, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by either one or both of analog electrical components, mixed mode components, and computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions, firmware, design model, or software include machine code that is directly executed by the one or more processors or computers, such as machine code produced by a compiler. In another example, the instructions, firmware, analog logic, or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions, firmware, or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

Although specific terminology has been used in this disclosure, it will be apparent after an understanding of the disclosure of this application that different terminology may be used to describe the same features, and such different terminology may appear in other applications.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless communication apparatus comprising:
an oscillator circuit configured to generate an oscillation signal corresponding to an oscillation frequency determined by an antenna; and
a bias generator circuit configured to reconfigure an operation region mode of a transistor included in the oscillator circuit by adjusting a bias signal in response to an enable signal.

2. The wireless communication apparatus of claim 1, wherein the bias generator circuit is configured to apply a first bias voltage to the transistor in a reception mode and apply a second bias voltage differing from the first bias voltage to the transistor in a transmission mode.

3. The wireless communication apparatus of claim 2, wherein the bias generator circuit is configured to apply the first bias voltage to the transistor in a transient state interval of the transmission mode and apply the second bias voltage to the transistor in a steady state interval after the transient state interval.

4. The wireless communication apparatus of claim 2, wherein the bias generator circuit is configured to apply the second bias voltage to a gate node of the transistor included in the oscillator circuit in response to a delayed transmission target signal.

5. The wireless communication apparatus of claim 2, wherein the bias generator circuit is configured to determine a magnitude of the second bias voltage based on a common mode voltage of an output signal, a differential voltage of the output signal, and a threshold of the transistor.

6. The wireless communication apparatus of claim 2, wherein the bias generator circuit is configured to determine a magnitude of the first bias voltage based on a common mode voltage of an output signal.

7. The wireless communication apparatus of claim 1, wherein the bias generator circuit is configured to configure the transistor included in the oscillator circuit to operate in a saturation region such that a current flowing through the antenna has a fundamental frequency in a transmission mode.

8. The wireless communication apparatus of claim 1, wherein the bias generator circuit is configured to prevent the transistor included in the oscillator circuit from operating in a deep triode region.

9. The wireless communication apparatus of claim 1, wherein the bias generator circuit is configured to supply the bias signal to the oscillator circuit by determining the bias signal such that an average value of the second bias voltage is greater than an average value of a drain voltage of the transistor.

10. The wireless communication apparatus of claim 1, wherein the bias generator circuit is configured to apply the bias signal to a gate node of the transistor included in the oscillator circuit.

11. The wireless communication apparatus of claim 1, wherein the antenna comprises a capacitor and an inductor.

12. The wireless communication apparatus of claim 11, wherein the capacitor comprises a capacitor bank having a variable capacitance value.

13. The wireless communication apparatus of claim 1, wherein, in a process of transmitting a transmission target signal, the oscillator circuit is configured to operate based on a first bias voltage in a transient state interval and operate based on a second bias voltage in a steady state interval, wherein the first bias voltage is different than the second bias voltage.

14. The wireless communication apparatus of claim 1, further comprising:
a transmission switch configured to connect a capacitor to a source node of the transistor included in the oscillator circuit in response to the wireless communication apparatus entering a transmission mode.

15. The wireless communication apparatus of claim 1, wherein the oscillator circuit comprises a transistor pair including two transistors connected to each other, a capacitor connecting a gate node of a transistor of the two transistors and a drain node of the other transistor of the two transistors, and a resistor connecting a gate node of a transistor of the two transistors and a gate node of the other transistor of the two transistors.

16. The wireless communication apparatus of claim 1, wherein the oscillator circuit comprises:
a first transistor pair including two N-type metal-oxide-semiconductor (NMOS) transistors mutually connected to be oscillated using a resistor and a capacitor; and
a second transistor pair including two P-type metal-oxide-semiconductor (PMOS) transistors mutually connected to be oscillated using a resistor and a capacitor.

17. The wireless communication apparatus of claim 1, further comprising:
a delay circuit configured to provide, to the bias generator circuit, a delayed transmission target signal generated by delaying a transmission target signal in response to the wireless communication apparatus entering a transmission mode.

18. The wireless communication apparatus of claim 1, further comprising:
a resonance switch configured to switch on or off a connection between both ends of the antenna in response to a transmission target signal; and
a current source switch configured to change a current flowing to the oscillator circuit in response to the transmission target signal.

19. The wireless communication apparatus of claim 18, wherein the wireless communication apparatus is configured to:

control the resonance switch and the current source switch based on the transmission target signal in a transmission mode; and control the resonance switch and the current source switch based on a quenching clock signal in a reception mode.

20. The wireless communications apparatus of claim 1, further comprising an antenna coupled to the oscillator circuit.

21. A wireless communication method comprising:

determining an operation region of a transistor included in an oscillator circuit by adjusting a bias signal in response to an applied signal; and generating, by the oscillator circuit comprising the transistor operating in the determined operation region, an oscillation signal corresponding to an oscillation frequency determined by an antenna.

22. The wireless communication method of claim 21, wherein the generating, by the oscillator comprising the transistor operating in the determined operation region, the oscillation signal corresponding to the oscillation frequency determined by the antenna, uses the antenna.

* * * * *